United States Patent
Koo et al.

(10) Patent No.: US 8,039,295 B2
(45) Date of Patent: Oct. 18, 2011

(54) ORGANIC INVERTER INCLUDING SURFACE-TREATED LAYER AND METHOD OF MANUFACTURING THE SAME

(75) Inventors: Jae Bon Koo, Daejeon (KR); Kyung Soo Suh, Daejeon (KR); Seong Hyun Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/906,457

(22) Filed: Oct. 18, 2010

(65) Prior Publication Data
US 2011/0033971 A1 Feb. 10, 2011

Related U.S. Application Data

(62) Division of application No. 11/931,461, filed on Oct. 31, 2007, now Pat. No. 7,842,952.

(30) Foreign Application Priority Data
Dec. 7, 2006 (KR) .......................... 10-2006-0123901

(51) Int. Cl.
H01L 51/40 (2006.01)
(52) U.S. Cl. ........................................ 438/99; 257/59
(58) Field of Classification Search .................. None
See application file for complete search history.

(56) References Cited

U.S. PATENT DOCUMENTS

| | | | |
|---|---|---|---|
| 3,903,431 A | 9/1975 | Heeren | |
| 3,946,245 A | 3/1976 | McClaughry | |
| 4,384,220 A | 5/1983 | Segawa et al. | |
| 4,417,162 A | 11/1983 | Keller et al. | |
| 4,714,840 A | 12/1987 | Proebsting | |
| 4,741,840 A | 5/1988 | Atherton et al. | |
| 5,598,020 A | * 1/1997 | Matsuo | ................. 257/401 |
| 5,598,103 A | 1/1997 | Lew et al. | |
| 5,699,007 A | 12/1997 | Farbarik et al. | |

(Continued)

FOREIGN PATENT DOCUMENTS

JP 05-152560 A 6/1993
(Continued)

OTHER PUBLICATIONS

Annie Wang, et al; "Tunable threshold voltage and flatband voltage in pentacene field effect transistors" Applied Physics Letters 89, 112109 (2006) 3 pages.

(Continued)

*Primary Examiner* — Ha Tran T Nguyen
*Assistant Examiner* — Vongsavanh Sengdara
(74) *Attorney, Agent, or Firm* — Ladas & Parry LLP

(57) ABSTRACT

An organic inverter and a method of manufacturing the same are provided, which regulates threshold voltages depending on positions when an inverter circuit is manufactured on a substrate using an organic semiconductor. To form a depletion load transistor and an enhancement driver transistor at adjacent positions of the same substrate, the surface of the substrate is selectively treated by positions or selectively applied by self-assembly monolayer treatment. Thus, a D-inverter having a combination of a depletion mode and an enhancement mode is more easily realized than a conventional method using a transistor size effect. Also, the D-inverter can be realized even with the same W/L ratio, thereby increasing integration density. That is, the W/L ratio does not need to be increased to manufacture a depletion load transistor, thereby improving integration density.

10 Claims, 4 Drawing Sheets

U.S. PATENT DOCUMENTS

| | | | |
|---|---|---|---|
| 5,705,413 | A | 1/1998 | Harkin et al. |
| 5,744,823 | A | 4/1998 | Harkin et al. |
| 5,998,103 | A | 12/1999 | Zhang |
| 6,462,723 | B1 | 10/2002 | Yamazaki et al. |
| 6,683,333 | B2 | 1/2004 | Kazlas et al. |
| 6,852,995 | B1 | 2/2005 | Eccleston et al. |
| 7,030,666 | B2 | 4/2006 | Brazis et al. |
| 7,122,398 | B1 | 10/2006 | Pichler |
| 2002/0139978 | A1 | 10/2002 | Yamazaki et al. |
| 2002/0145582 | A1 | 10/2002 | Yamazaki et al. |
| 2004/0119504 | A1 | 6/2004 | Baude et al. |
| 2004/0169176 | A1 | 9/2004 | Peterson et al. |
| 2004/0247790 | A1* | 12/2004 | Moriyama ............ 427/256 |
| 2005/0158929 | A1* | 7/2005 | Yamazaki et al. ........ 438/166 |
| 2005/0260803 | A1 | 11/2005 | Halik et al. |
| 2006/0033086 | A1 | 2/2006 | Gerlach |
| 2006/0197092 | A1 | 9/2006 | Hoffman et al. |
| 2007/0102697 | A1 | 5/2007 | Chen et al. |
| 2007/0114524 | A1* | 5/2007 | Oh et al. ................ 257/40 |
| 2007/0194386 | A1* | 8/2007 | Hahn et al. .............. 257/368 |
| 2007/0272948 | A1 | 11/2007 | Koo et al. |
| 2008/0135947 | A1 | 6/2008 | Koo et al. |
| 2008/0224127 | A1* | 9/2008 | Marks et al. ............ 257/40 |
| 2008/0246095 | A1 | 10/2008 | Wu et al. |

FOREIGN PATENT DOCUMENTS

| | | |
|---|---|---|
| JP | 06-151307 A | 5/1994 |
| JP | 2003-243657 A | 8/2003 |
| JP | 2003-273228 A | 9/2003 |
| JP | 2004-246349 A | 9/2004 |
| JP | 2005-079549 A | 3/2005 |
| JP | 2005-166713 A | 6/2005 |
| JP | 2006-013108 A | 1/2006 |
| KR | 1999-0073642 A | 10/1999 |
| KR | 10-0259591 B1 | 3/2000 |
| KR | 1020020001169 A | 1/2002 |
| KR | 1020020096743 A | 12/2002 |
| KR | 1020040063325 A | 7/2004 |
| KR | 1020060070350 A | 6/2006 |

OTHER PUBLICATIONS

G.H.Gelinck, et al; "Dual-gate organic thin-film transistors", Applied Physics Letters 87, 073508 (2005), 3 pages.

Hagen Klauk, et al; "Fast Organic Thin-Film Transistor Circuits", IEEE Electron Device Letters, vol. 20, No. 6, Jun. 1999, 3 pages.

Hagen Klauk, et al; "Flexible Organic Complementary Circuits", IEEE Transactions on Electron Devices, vol. 52, No. 4, Apr. 2005, 5 pages.

Shingo Iba, et al; "Control of threshold voltage of organic field-effect transistors with double-gate structures", Applied Physics Letters, 87, 2005, 3 pages.

USPTO OA mailed Feb. 4, 2009 in connection with U.S. Appl. No. 11/693,830.

USPTO OA mailed Jun. 9, 2009 in connection with U.S. Appl. No. 11/693,803.

USPTO OA mailed Oct. 29, 2009 in connection with U.S. Appl. No. 11/693,830.

USPTO OA mailed May 20, 2010 in connection with U.S. Appl. No. 11/693,830.

USPTO OA mailed Feb. 3, 2009 in connection with U.S. Appl. No. 11/931,461.

USPTO OA mailed Mar. 30, 2009 in connection with U.S. Appl. No. 11/931,461.

USPTO OA mailed Sep. 29, 2009 in connection with U.S. Appl. No. 11/931,461.

USPTO OA mailed Feb. 19, 2010 in connection with U.S. Appl. No. 11/931,461.

USPTO NOA mailed Jul. 26, 2010 in connection with U.S. Appl. No. 11/931,461.

USPTO OA mailed Oct. 28, 2008 in connection with U.S. Appl. No. 11/834,044.

USPTO OA mailed Jan. 26, 2009 in connection with U.S. Appl. No. 11/834,044.

USPTO OA mailed Jun. 23, 2009 in connection with U.S. Appl. No. 11/834,044.

USPTO NOA mailed Dec. 1, 2009 in connection with U.S. Appl. No. 11/834,044.

* cited by examiner

ORGANIC INVERTER INCLUDING SURFACE-TREATED LAYER AND METHOD OF MANUFACTURING THE SAME

CROSS-REFERENCE TO RELATED APPLICATION

This application claims priority to and the benefit of Korean Patent Application No. 2006-123901, filed on Dec. 7, 2006, the disclosure of which is incorporated herein by reference in its entirety.

BACKGROUND

1. Field of the Present Invention

The present invention relates to an organic inverter and a method of manufacturing the same, and more particularly, to an organic inverter including a surface-treated insulating layer, and a method of manufacturing the same. The present invention has been produced from the work supported by the IT R&D program of MIC (Ministry of Information and Communication)/IITA (Institute for Information Technology Advancement) [2005-S070-02, Flexible Display] in Korea.

2. Discussion of Related Art

An organic field-effect transistor is spotlighted as the next-generation electronic device because it has a simple process and may be manufactured on a flexible plastic substrate at low temperature compared to conventional silicon transistors. The organic field-effect transistor is used as a switching device in a flexible display, or used to manufacture a circuit such as organic radio frequency identification (RFID). When the organic field-effect transistor is used as a pixel driving switch of a display, it may be a transistor with a single polarity (i.e., a p-type transistor), but when it is used as a circuit, a CMOS transistor that is a combination of p- and n-type transistors is the most preferable for reducing power consumption or raising speed.

However, since organic semiconductors have not stable characteristics and reliability with respect to n-type devices so far, an inverter is generally formed of only a p-type transistor.

FIGS. 1A and 1B illustrate structures of D- and E-inverters which are formed of only a conventional p-type transistor. FIG. 1A illustrates a depletion-mode inverter in which a depletion transistor 1 is formed as a load, and an enhancement transistor 2 is formed as a driver. FIG. 1B illustrates an enhancement inverter having an enhancement transistor, which is used as both load and driver transistors 3 and 4. The former is commonly known as a D-inverter or a zero-driver load logic inverter, and the latter as an E-inverter or a diode-connected load logic inverter. The D-inverter illustrated in FIG. 1A provides better results in power consumption, gain and swing width than the E-inverter.

However, unlike the conventional silicon semiconductor, the organic semiconductor made of an organic material cannot control a threshold voltage by doping, and thus it is difficult to manufacture devices, which have different threshold voltage characteristics depending on positions on the same substrate. Until now, the variation of transistor dimension W/L (channel width/length) was an established solution for fabricating the load transistor of depletion mode and the driver transistor of enhancement mode in the same substrate for D-inverter. As the channel length is reduced, the shift from enhancement mode to depletion mode is observed. Thus, it is not easy to use the depletion load transistor with a relatively high W/L ratio in manufacturing a highly-integrated organic circuit with high resolution, and all the characteristics according to a size ratio have to be obtained for circuit design, since voltage transfer characteristics such as a speed or swing width depend on the size ratio between the depletion load transistor and the enhancement driver transistor.

In other words, in manufacturing a conventional organic inverter, a transistor with a high W/L ratio is generally used as a depletion load transistor due to a large current at a gate voltage ($V_G$) of 0V, and a transistor with a small W/L ratio is generally used as an enhancement driver transistor due to a relatively small current at a gate voltage ($V_G$) of 0V. Thus, prior to the design and manufacture of the inverter, all characteristics of the transistors depending on W/L ratios have to be ensured to obtain optimal conditions.

SUMMARY OF THE PRESENT INVENTION

The present invention provides an organic inverter and a method of manufacturing the same, which is manufactured by performing different surface-treatments depending on respective positions in order to control a threshold voltage to solve problems encountered when an inverter including a depletion load transistor and an enhancement driver transistor is manufactured using a difference in channel width/channel length (W/L) ratios of these transistors.

One aspect of the present invention provides an organic inverter comprising: a load transistor including a gate electrode, source and drain electrodes, and a load insulating layer formed on the gate electrode, the source electrode being connected to the gate electrode; a driver transistor connected to the load transistor and including a gate electrode, source and drain electrodes and a driver insulating layer formed on the gate electrode; and a surface-treated layer formed on one of the load insulating layer and the driver insulating layer by performing different surface treatments on the load insulating layer and the driver insulating layer.

The surface-treated layer formed on the load insulating layer may be formed by physically damaging the load insulating layer by UV-ozone treatment, $O_2$ treatment, or laser irradiation. The surface-treated layer formed on the driver insulating layer may be formed by selectively treating the surface of the driver insulating layer using octadecyltrichlorosilane (OTS) or hexamethyldisilazane (HMDS). The source, drain and gate electrodes may be formed of a metallic material, a conductive oxide or a conductive polymer. The gate electrode may be formed of Ti, Cu, Cr, Al, Au, Mo, W, ITO, IZO or PEDOT. The source and drain electrodes may be formed of Au, Pt, Ni, Pd, ITO, IZO or PEDOT. The load transistor and the driver transistor may be a bottom gate type and a top gate type, respectively.

Another aspect of the present invention provides a method of manufacturing an organic inverter comprising the steps of: forming a driver transistor including a gate electrode, a driver insulating layer and source and drain electrodes on a substrate; forming a load transistor including a gate electrode, a load insulating layer and source and drain electrodes on the substrate; surface-treating one of the driver insulating layer and the load insulating layer; and forming organic semiconductor layers on the load insulating layer or the driver insulating layer that is surface-treated and the driver insulating layer or the load insulating layer that is not surface-treated, respectively.

The surface treating step may be performed using a selective mask to selectively treat the load insulating layer by UV-ozone treatment, $O_2$ plasma treatment, or laser irradiation. Also, the surface treating step may further comprise the steps of: applying OTS or HMDS onto the entire surface of the substrate to selectively treat the surface of the driver insulating layer with OTS or HMDS; and removing the OTS or HMDS applied onto the surface of the substrate utilizing the selective surface treatment mask by UV-ozone treatment, $O_2$ plasma treatment or laser irradiation.

The surface treating step may be performed using a printing technique to selectively treat the surface of the driver insulating layer with OTS or HMDS.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the present invention are shown.

Figure 1A:
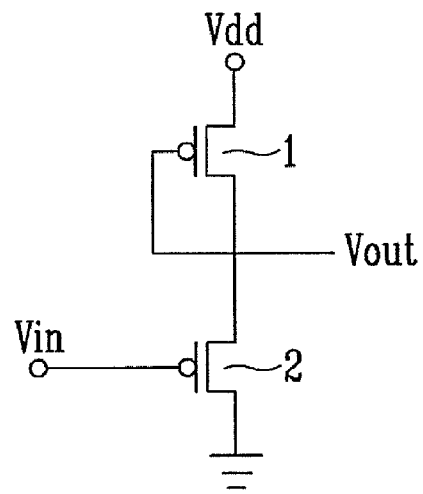
FIGS. 1A and 1B illustrate structures of D- and E-inverters which are formed of only a conventional p-type transistor.
Figure 1B:
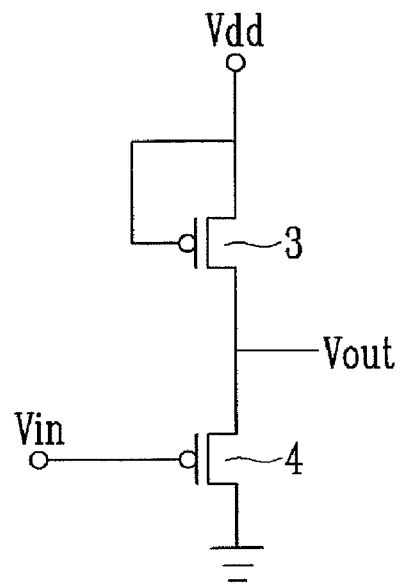
Figure 2:
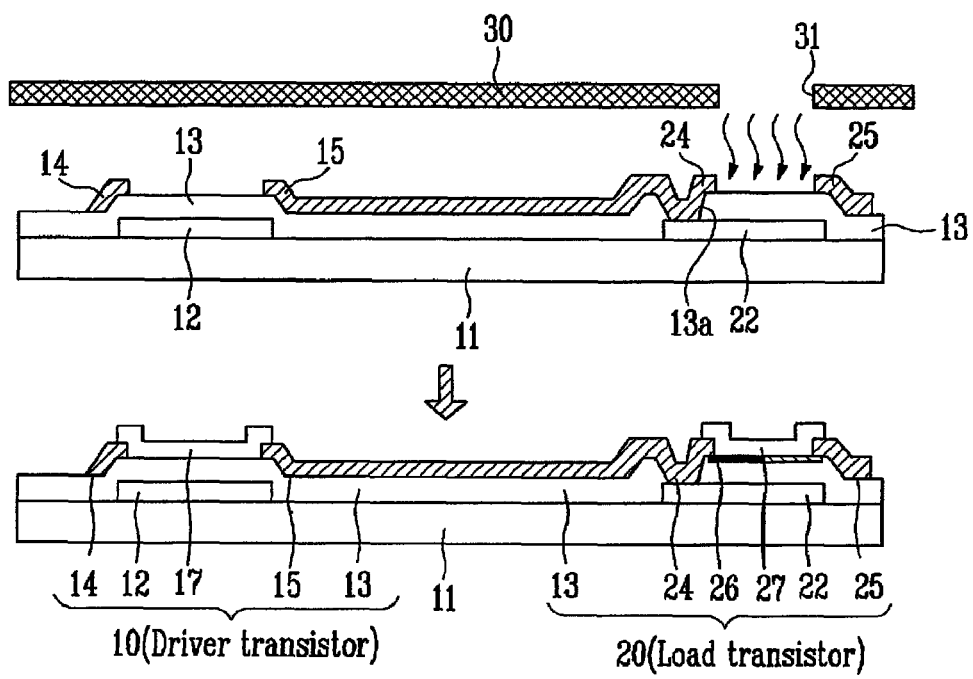
FIGS. 2 to 4 are cross-sectional views partially illustrating a manufacturing process of an organic inverter according to first to third exemplary embodiments of the present invention.
Figure 4:
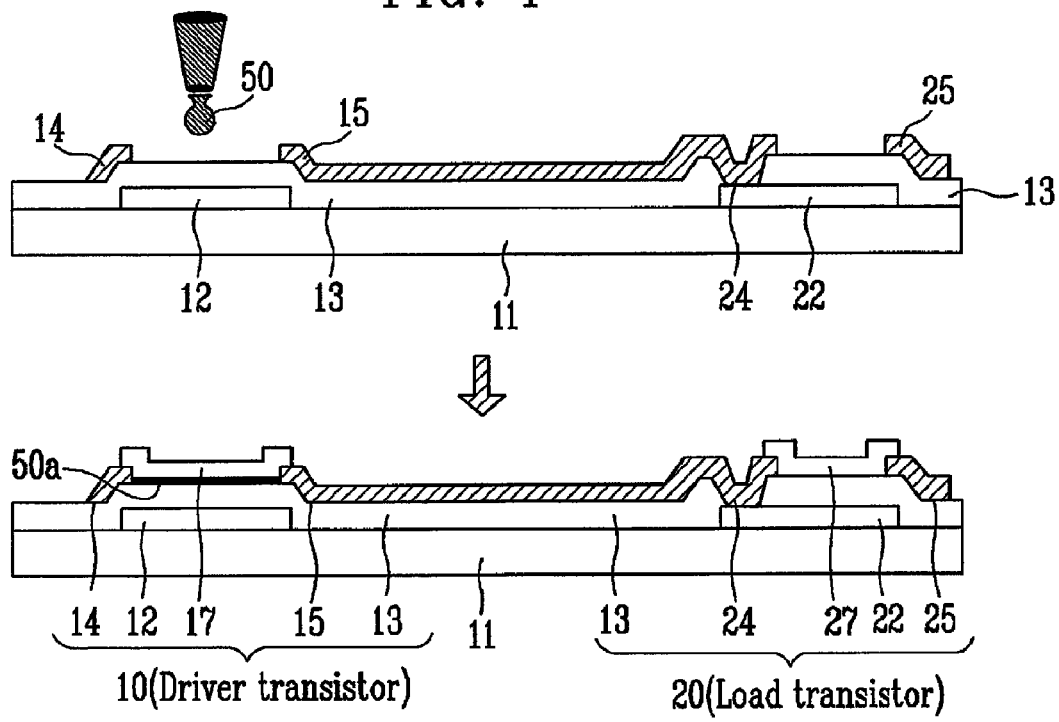

FIGS. 2 and 4 are cross-sectional views partially illustrating a manufacturing process of an organic inverter according to first to third exemplary embodiments of the present invention.

Referring to FIG. 2 illustrating a first exemplary embodiment, to manufacture an organic inverter including a driver transistor 10 and a load transistor 20 according to the present invention, a substrate 11 is first prepared. A pair of gate electrodes 12 and 22 are then formed on the prepared substrate 11. After forming the gate electrodes 12 and 22, a gate insulating layer 13 is formed on the gate electrodes 12 and 22. Then, source and drain electrodes 14 and 15 of the driver transistor 10, and source and drain electrodes 24 and 25 of the load transistor 20 are formed on the gate insulating layer 13. Here, the source electrode 24 of the load transistor 20 is electrically connected to the gate electrode 22 through a contact hole 13a formed in the gate insulating layer 13. The source, drain and gate electrodes may be formed of a metallic material, a conductive oxide or a conductive polymer. The gate electrode may be formed of Ti, Cu, Cr, Al, Au, Mo, W, ITO, IZO or PEDOT. The source and drain electrodes may be formed of Au, Pt, Ni, Pd, ITO, IZO or PEDOT.

A mask 30 having an opening 31 that is selectively opened over the load transistor 20 is disposed over the substrate 11. After that, a physically-damaged layer 26 is formed on a top surface of the insulating layer 13 in the load transistor 20 by performing at least one of UV-ozone treatment, $O_2$ plasma treatment and laser irradiation through the opening 31. After removal of the mask 30, organic semiconductor layers 17 and 27 are formed on the insulating layer 13 in the driver transistor 10 and the physically damaged layer 26 in the load transistor 20, respectively.

Referring to FIG. 2, the driver transistor 10 and the load transistor 20, both of which are formed on the substrate 11, have a bottom gate organic semiconductor transistor structure. As described above, the physically-damaged layer 26 is formed by applying physical damage to the insulating layer 13, thereby generating mobile charges. Thus, a depletion transistor having a positive threshold voltage can be manufactured by these charges existing even when not accumulated due to a gate voltage. In general, a p-type transistor is an enhancement-type transistor with a negative threshold voltage, which is used as a driver transistor.

Figure 3:
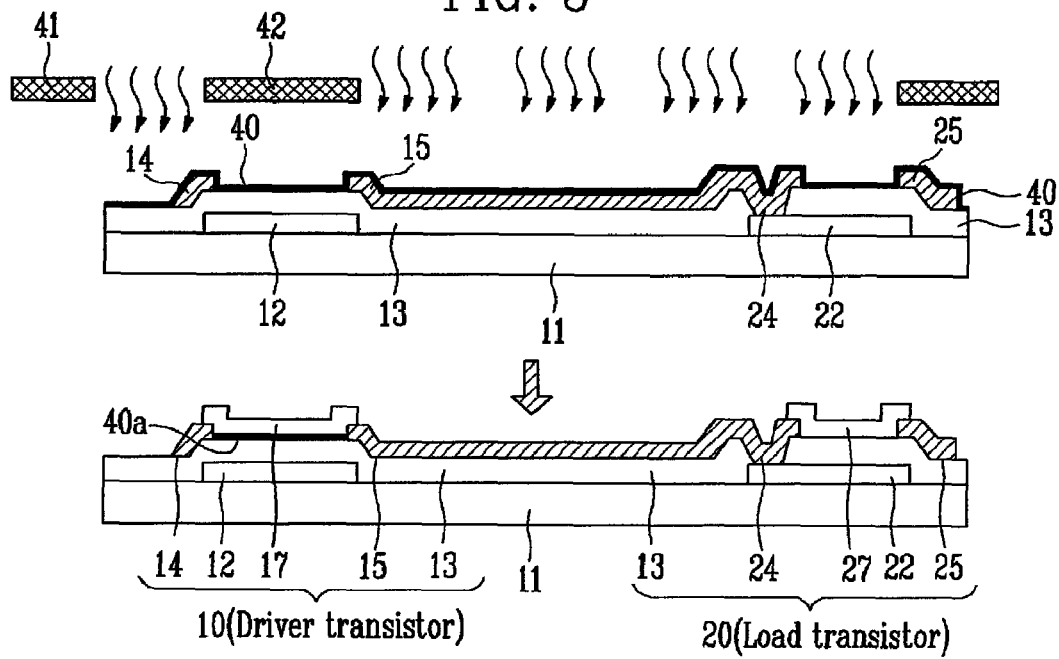

Referring to FIG. 3 illustrating a second exemplary embodiment, to manufacture an organic inverter comprising a driver transistor 10 and a load transistor 20 according to the present invention, a substrate 11 is first prepared. Then, a pair of gate electrodes 12 and 22 are formed on the prepared substrate 11. A gate insulating layer 13 is formed on the gate electrodes 12 and 22. Source and drain electrodes 14 and 15 of the diver transistor 10 and source and drain electrodes 24 and 25 of the load transistor 20 are formed on the gate insulating layer 13. Here, the source electrode 24 of the load transistor 20 is electrically connected to the gate electrode 22 through a contact hole formed in the gate insulating layer 13.

A surface-treated layer 40 is formed on the entire surface of the source and drain electrodes 14, 15, 24 and 25 and the exposed insulating layer 13. The surface-treated layer 40 is formed by treating the top surface of the insulating layer 13 with a hydrophobic material to be matched with hydrophobic characteristics of organic semiconductor layers 17 and 27 that will be formed in the subsequent process. Examples of the hydrophobic material for surface treatment may include octadecyltrichlorosilane (OTS) and hexamethyldisilazane (HMDS). The surface-treated layer 40 consisting of the hydrophobic material for surface treatment completely covers the insulating layer 13 and the source and drain electrodes by a spin coating or deep coating technique.

After the surface-treated material is applied on the entire surface of the substrate 11, a mask 41 having a blocking part 42, which selectively blocks only the top of the gate electrode 12 of the driver transistor 10, is provided over the substrate 11. The surface-treated layer 40 formed over the source and drain electrodes 14, 15, 24 and 25 as well as the insulating layer 13 is removed by applying at least one of the UV-ozone treatment, $O_2$ plasma treatment and laser irradiation onto the entire surface of the substrate 11. Here, only the surface-treated layer 40a, which is formed on the insulating layer 13 of the driver transistor 10 shielded by the blocking part 42, remains. In the next step, the mask 41 is completely removed, and organic semiconductor layers 17 and 27 are formed on the surface-treated layer 40a of the driver transistor 10 and the insulating layer 13 of the load transistor 20, respectively.

Referring to FIG. 4, another process of manufacturing an organic inverter according to the present invention is illustrated. The process in FIG. 4 is substantially the same as that in FIG. 3, except for the process of forming a surface-treated layer on an insulating layer, and thus the detailed description thereof will be omitted.

A driver transistor 10 and a load transistor 20, both of which comprise gate electrodes 12 and 22, source and drain electrodes 14, 15, 24 and 25 and an insulating layer 13, are formed on a substrate 11. Then, a surface treatment process is selectively applied to a surface of the insulating layer 13 constituting the driver transistor 10. Here, in order to facilitate the surface treatment, an ink-jet apparatus 50 is used. After a surface-treated layer 50a is formed on the insulating layer 13 of the driver transistor 10, organic semiconductor layers 17 and 27 are formed on the surface-treated layer 50a of the driver transistor 10 and the insulating layer 13 of the load transistor 20.

Figure 5:
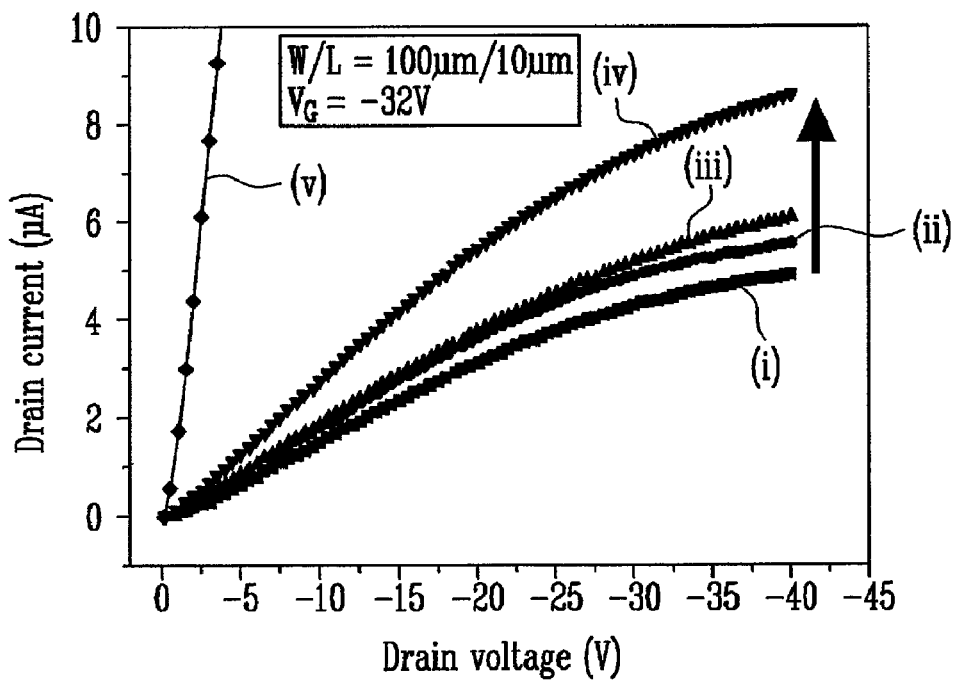
FIG. 5 is a graph of drain current depending on the time taken for treating an organic insulating layer with UV-ozone in an organic semiconductor transistor according to the present invention.

FIG. 5 is a graph of drain current depending on the time taken for treating an organic insulating layer with UV-ozone in an organic semiconductor transistor according to the present invention. Particularly, FIG. 5 illustrates drain current versus the time taken when an organic insulating layer is treated with UV-ozone in an organic semiconductor transistor using a pentacene organic semiconductor. Here, a channel width/effective channel length (W/L) of the transistor is 100 μm/10 μm and a gate voltage is −32V. In FIG. 5, an x-axis represents a drain voltage ($V_P$), and a y-axis represents a drain current ($I_P$).

Graph (i) is before performing UV-ozone treatment. Graph (ii) is after performing the UV-ozone treatment for 10 seconds, Graph (iii) is after performing the UV-ozone treatment for 30 seconds, Graph (iv) is after performing the UV-ozone treatment for 1 minute, and Graph (v) is after performing the UV-ozone treatment for 3 minutes. From these graphs, it can be seen that the drain current significantly increases as the UV-ozone treating time is longer under the same gate voltage. The present invention shows the organic semiconductor transistor manufactured by the UV-ozone treatment, but it may provide the same result using a physical-damaged layer formed by $O_2$ plasma or laser irradiation treatment. That is, the physical-damaged layer may be formed on the organic insulating layer through the $O_2$ plasma or laser irradiation treatment, as well as the UV-ozone treatment, and thus a depletion load transistor may be manufactured.

Figure 6:
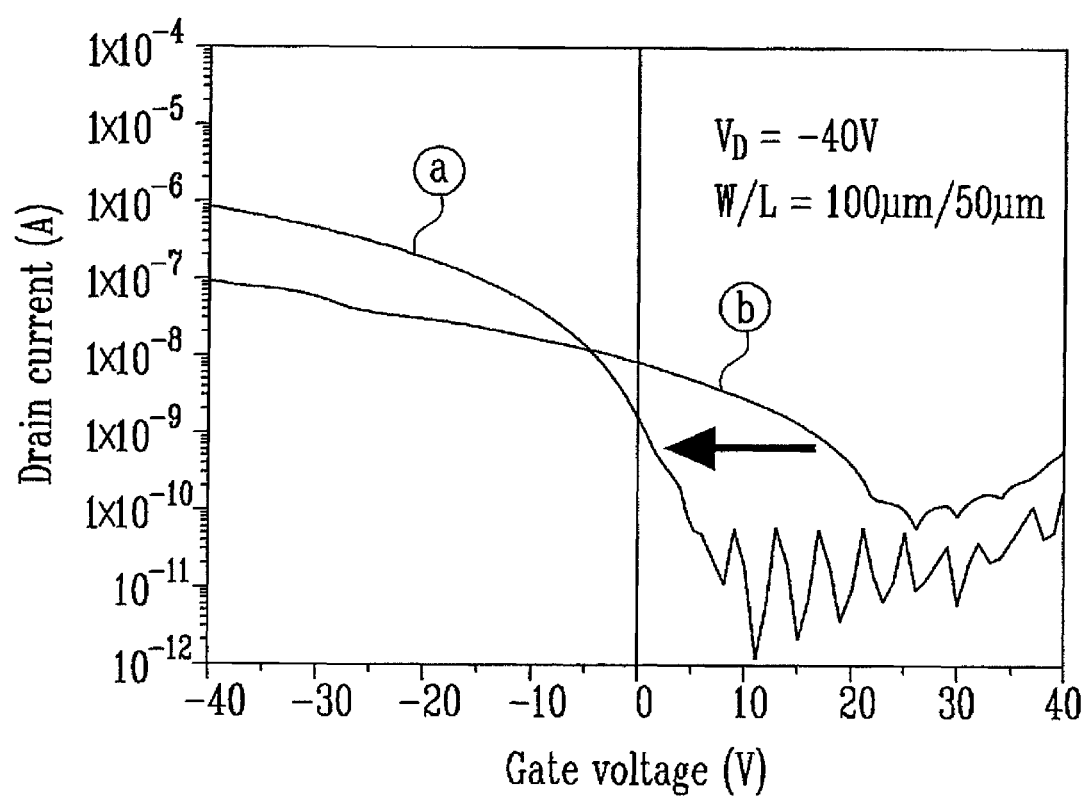
FIG. 6 is a graph showing the relationship between a turn-on voltage and a threshold voltage of an organic transistor before and after surface treatment (HMDS treatment) in an organic semiconductor transistor according to the present invention.

FIG. 6 is a graph showing the relationship between a turn-on voltage and a threshold voltage of an organic transistor before and after surface treatment (HMDS treatment) in an organic semiconductor transistor according to the present invention. A pentacene organic semiconductor is also used in FIG. 6, in which an x-axis represents a gate voltage and a y-axis represents a drain current.

Graph □ is after performing HMDS treatment, and Graph □ is before performing the HMDS treatment. As seen from these graphs, the turn-on voltage and threshold voltage of the pentacene organic transistor move in a direction of a negative gate voltage after performing the HMDS treatment (see Graph □). This is because the surface of the insulating layer becomes hydrophobic or non-polar after self-assembled monolayer (SAM) treatment, extra hole charges are not generated in the pentacene, and thus the threshold voltage moves in a negative direction. That is, hydroxyl (OH—) groups adsorbed on the hydrophobic surface of the insulating layer generate the extra hole charges in the pentacene, such that the transistor can have a depletion characteristic. The structure of the organic semiconductor transistor having the depletion characteristic, that is, a method of selectively treating only the driver transistor, which needs a negative threshold voltage, with OTS and HMDS, is illustrated in FIGS. 3 and 4.

According to the present invention, a D-inverter having a combination of a depletion mode and an enhancement mode may be more easily realized than the conventional art using a transistor size effect. Also, according to the present invention, the D-inverter may be realized even with the same W/L ratio, thereby increasing integration density. That is, the W/L ratio does not need to be higher to manufacture a depletion load transistor, thereby improving the integration density.

While the present invention has been shown and described with reference to certain exemplary embodiments thereof, it will be understood by those skilled in the art that various changes in form and details may be made therein without departing from the spirit and scope of the present invention as defined by the appended claims.

What is claimed is:

1. A method of manufacturing an organic inverter, comprising the steps of:
    forming a driver transistor including a gate electrode, a driver insulating layer, a source electrode, and a drain electrode on a substrate;
    forming a load transistor including a gate electrode, a load insulating layer, a source electrode, and a drain electrode on the substrate;
    surface-treating one of the driver insulating layer or the load insulating layer; and
    forming organic semiconductor layers on the surface-treated insulating layer and the non-surface-treated insulating layer among the load insulating layer and the driver insulating layer,
    wherein the load transistor and the driver transistor are formed such that the drain electrode of the driver transistor is directly connected to the gate electrode of the load transistor.

2. The method according to claim 1, wherein the surface treatment is performed using a selective mask to selectively treat only the load insulating layer by UV-ozone treatment, O2 plasma treatment, or laser irradiation.

3. The method according to claim 1, wherein the surface treatment further comprises the steps of:
    applying OTS or HMDS onto the entire surface of the substrate to selectively treat the surface of the driver insulating layer with OTS or HMDS; and
    removing the OTS or HMDS applied onto the surface of the substrate using a selective surface treatment mask by UV-ozone treatment, O2 plasma treatment or laser irradiation.

4. The method according to claim 1, wherein the surface treatment is performed using a printing technique to selectively treat the surface of the driver insulating layer with OTS or HMDS.

5. The method according to claim 1, wherein the surface-treating of only one of the driver insulating layer or the load insulating layer is conducted such that the load transistor is a depletion-type transistor and the driver transistor is an enhancement-type transistor.

6. The method according to claim 1, wherein the load transistor and the driver transistor are formed such that the driver transistor and the load transistor have substantially the same W/L ratio.

7. A method of manufacturing an organic inverter, comprising the steps of:
    forming a driver transistor including a gate electrode, a driver insulating layer, a source electrode, and a drain electrode on a substrate;
    forming a load transistor including a gate electrode, a load insulating layer, a source electrode, and a drain electrode on the substrate;
    surface-treating one of the driver insulating layer or the load insulating layer, such that the load transistor is a depletion-type transistor and the driver transistor is an enhancement-type transistor; and
    forming organic semiconductor layers on the surface-treated insulating layer and the non-surface-treated insulating layer among the load insulating layer and the driver insulating layer,
    wherein the load transistor and the driver transistor are formed such that the drain electrode of the driver transistor is directly connected to the gate electrode of the load transistor, and the load transistor and the driver transistor have substantially the same W/L ratio.

8. The method according to claim 7, wherein the surface treatment is performed using a selective mask to selectively treat only the load insulating layer by UV-ozone treatment, O2 plasma treatment, or laser irradiation.

9. The method according to claim 7, wherein the surface treatment further comprises the steps of:
applying OTS or HMDS onto the entire surface of the substrate to selectively treat the surface of the driver insulating layer with OTS or HMDS; and removing the OTS or HMDS applied onto the surface of the substrate using a selective surface treatment mask by UV-ozone treatment, O2 plasma treatment or laser irradiation.

10. The method according to claim 7, wherein the surface treatment is performed using a printing technique to selectively treat the surface of the driver insulating layer with OTS or HMDS.

* * * * *